United States Patent [19]
Carlo

[11] 3,990,037
[45] Nov. 2, 1976

[54] PARALLEL ACCESS BUBBLE MEMORY

[75] Inventor: James Thomas Carlo, Richardson, Tex.

[73] Assignee: Texas Instruments Incorporated, Dallas, Tex.

[22] Filed: Mar. 20, 1975

[21] Appl. No.: 560,411

[52] U.S. Cl. .................. 340/174 TF; 340/174 YC
[51] Int. Cl.² ........................................ G11C 11/14
[58] Field of Search .............. 340/174 TF, 174 YC, 340/174 GB; 350/151

[56] References Cited
UNITED STATES PATENTS
3,859,643  1/1975  Borrelli ........................ 340/174 TF Primary Examiner—James W. Moffitt
Attorney, Agent, or Firm—Harold Levine; James T. Comfort; William E. Hiller

[57] ABSTRACT

A parallel access magnetic bubble memory system comprising a planar thin film optical waveguide for the propagation of linearly polarized light along a first axis and a coupler for coupling light into the guide. Detectors are positioned along the axis of the waveguide. Magnetic bubbles are moved from memory storage locations past respective detectors on respective second axes each transverse the first axis. Each of the detectors includes a coupler for coupling light out of the waveguide. The passage of magnetic bubbles past each respective detector will modulate the polarized light by the fringing fields of the bubbles and provide discrete light output signals from the respective detectors thereby indicating the passage of these bubbles.

18 Claims, 10 Drawing Figures

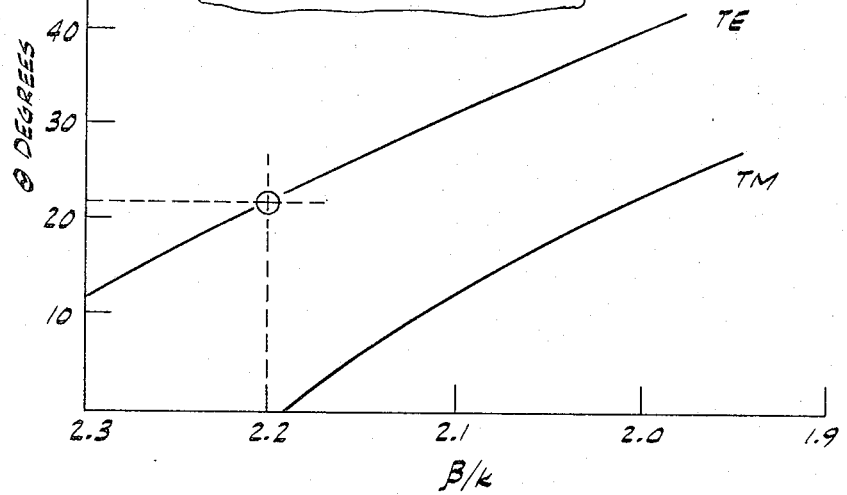
FIG. 5A
FIG. 5B
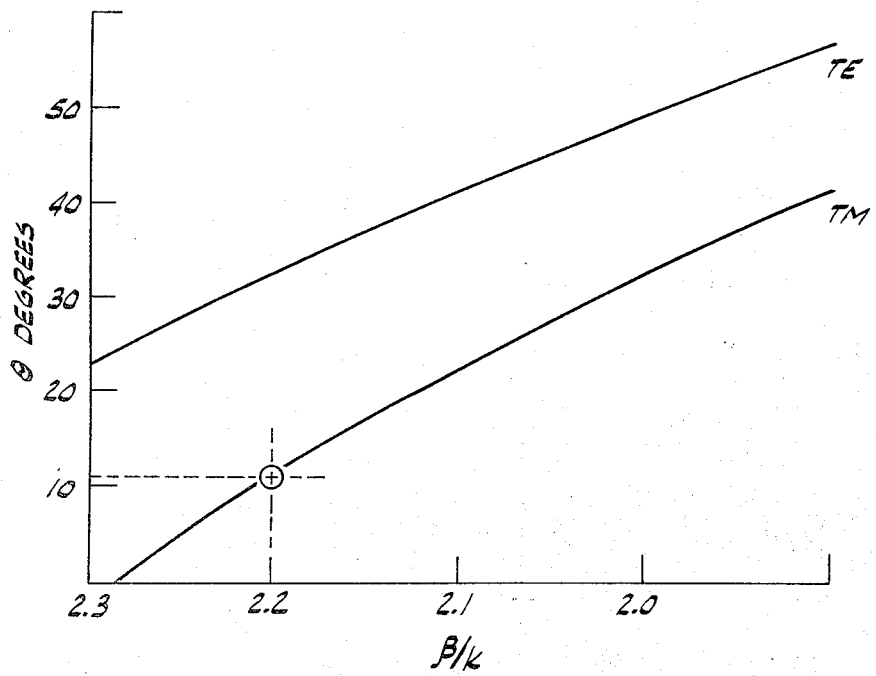
FIG. 4A
FIG. 4B

PARALLEL ACCESS BUBBLE MEMORY

BACKGROUND OF THE INVENTION

This invention relates to parallel access magnetic bubble memory systems and more particularly to such systems employing integrated optics techniques for bubble detection.

Substantial advances have been made in many areas of cylindrical domain or magnetic bubble technology, but one of the significant problems remaining is that of accessing bubble memories by providing a readout. Various types of detectors have been developed for reading or detecting magnetic bubbles as they are moved along a predetermined path and past a read position of a magnetic domain memory. These detectors provide a discrete output signal indicative of the passage of a bubble by the read position. The majority of such detection systems have utilized various magneto-resistive elements, usually formed of a pattern of magnetically soft overlay material, to electrically sense the flux field of the bubble and thereby provide an electrical signal. Such detectors may be satisfactorily fabricated and provide a generally acceptable signal-to-noise ratio, but it would be desirable to be able to provide a detector with an enhanced signal-to-noise ratio. Moreover, these detectors require electronic detector elements and their leads to be placed on the memory chip, all of which diminishes the space available for memory storage on the chip. Prior magnetic bubble memory systems have typically utilized major/minor loop organizations with a single detector used for serially accessing bubbles moved from the minor loops onto the major loop.

The presence of magnetic bubbles in typical magnetic-bubble garnet layers has also been sensed or detected optically but, because of the precise alignment requirements of the optics relative to the detection area and the difficulty in economically fabricating such optical arrangements, progress has been slow in this area and optical methods have hitherto appeared unsuitable in a practical sense.

SUMMARY OF THE INVENTION

Among the several objects of this invention may be noted the provision of magnetic bubble detection systems utilizing integrated optics which permit separation of optical and electronic functions of the detection system; the provision of such systems which permit close spacing of detection regions on bubble memory chips and avoid the placement of electronic elements of the detector system on these chips; the provision of such systems in which a separate detector may be utilized for each minor loop in a major/minor loop memory organization thereby providing parallel access or read out at each minor loop; the provision of magnetic bubble detector systems which reliably sense the presence of bubbles and supply an output signal of improved magnitude at enhanced signal-to-noise ratios; and the provision of such detectors which may be fabricated using existing technology.

Briefly, a parallel access magnetic bubble memory system of this invention comprises a planar thin film optical waveguide for the propagation of linearly polarized light along a first axis and means for coupling light into the guide. A plurality of detectors are positioned along the axis of the waveguide. Means are provided for moving magnetic bubbles from memory storage locations past respective detectors on respective second axes each transverse the first axis. Each of the detectors includes means for coupling light out of the waveguide whereby the passage of magnetic bubbles past each respective detector will modulate the polarized light by the fringing fields of the bubbles and provide discrete light output signals from the respective detectors thereby indicating the passage of bubbles.

Other objects and features will be in part apparent and in part pointed out hereinafter.

BRIEF DESCRIPTION OF THE DRAWINGS

FIGS. 4A and 5A, respectively, diagrammatically illustrate sections through a bubble chip utilizing prisms to couple polarized light into and out of the waveguide component of a detection system of this invention;

FIGS. 4B and 5B, respectively, graphically represent the relationships between the angles of incidence and emergence versus the propagation constant ratios of the two polarized modes of light propagating down the guide;

Corresponding reference characters indicate corresponding parts throughout the several views of the drawings.

DESCRIPTION OF PREFERRED EMBODIMENTS

Figure 1:
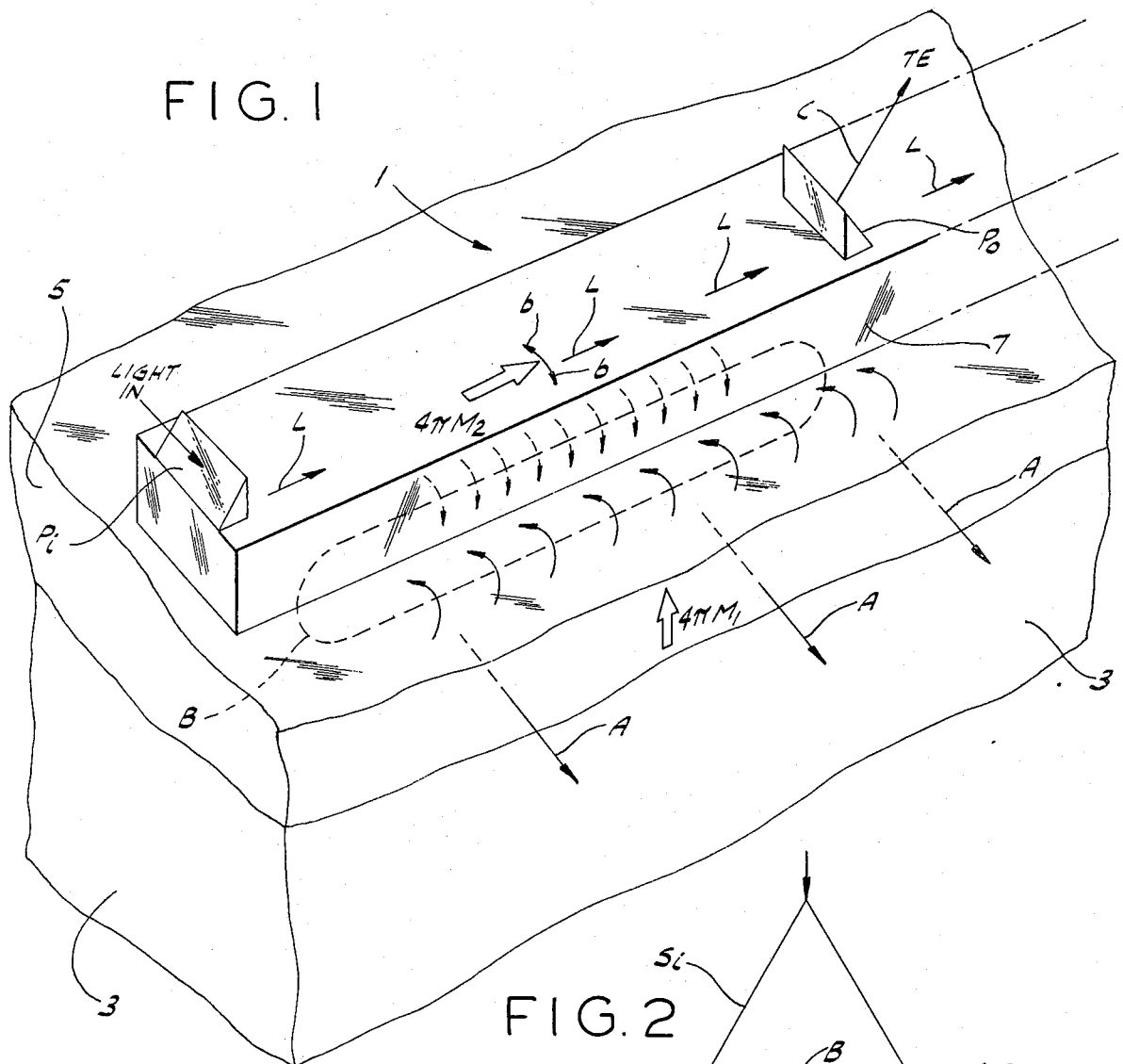
FIG. 1 is a trimetric view on a greatly enlarged scale of a portion of a magnetic bubble detection system of the present invention.

Referring now to the drawings, and more particularly to FIG. 1, the initial portion of a magnetic bubble detection system of this invention is indicated generally at 1. It is formed on the surface of a chip of a typical cylindrical magnetic domain material, such as an oriented slice cut from a single crystal of rare earth garnet, e.g., gadolinium-gallium garnet, $Gd_3Ga_5O_{12}$, constituting a nonmagnetic substrate portion 3 with a magnetic garnet planar layer 5 possessing uniaxial anisotrophy and usually formed by epitaxial deposition on substrate 3. This layer has an easy direction of magnetization perpendicular to the plane of the layer. A typical magnetic garnet material for the propagation of bubbles is samarium garnet, $Y_{2.6}Sm_{0.4}Fe_{3.9}Ga_{1.1}O_{12}$. This layer constitutes a bubble propagation layer of film and has a thickness, for example, of about 4 to 5 microns for the propagation of magnetic bubbles having a nominal size of about 5 microns. The index of refraction of layer 5 is greater than that of substrate 3.

A planar film 7 constitutes the upper region of the chip and may be either an epitaxial layer deposited on the surface of layer 5 or a planar film formed by ion implantation in the exposed surface of layer 5. In either instance, film 7 is a magneto-optical material and has an easy direction of magnetization in the plane of the film. It has an index of refraction that may be the same as that of layer 5, or substantially greater. A typical epitaxially deposited film 7 has a composition of $Y_{2.4}Gd_{0.6}Fe_5O_{12}$, and is about 1 micron thick.

Coherent light, such as that generated by a helium-neon laser with a wavelength of 1.15 microns, is optically coupled into the film by means of a prism Pi as indicated in FIG. 1, with the angle of incidence of the polarized light, either TM (transverse magnetic) mode or TE (transverse electric) mode, selected in accordance with the optical parameters, as will be described hereinafter. If film 7 has a refractive index significantly greater than that of layer 5 and the surrounding medium (e.g., air), it will serve as a waveguide with plane or linearly polarized light L propagating along a lengthwise axis thereof as illustrated. Film 7 also functions to suppress hard bubbles.

Input and output couplers or prisms Pi and Po are so positioned on the bubble chip surface that the axis of the light propagating in the guide is transverse to the direction of bubble movement along a bubble path or circuit (not shown) such as is customarily used for memory loops or other registers of a magnetic bubble memory organization. Preferably the bubbles, as they are moved in layer 5 by the customary rotating in-plane magnetic drive field, are stretched by any of the conventional bubble elongation schemes in a direction transverse their direction of movement (as indicated by arrows A), i.e., parallel to the axis of light propagation in the waveguide. A typical stretcher is formed by a series of parallel rows of chevron-shaped circuit elements of soft magnetic material with the lengths of each successive row increasing in the direction of bubble movement toward the axis of light propagation and decreasing in length as the bubble moves away therefrom. This is diagrammatically represented in FIG. 2 by the generally diamond-shaped-in-plan pattern outline with Si indicating the input portion of the domain expander or stretcher and So indicating the output portion. A stretched or expanded magnetic bubble or strip domain is indicated at B as it moves under the light path in the waveguide.

The curved arrows in FIG. 1 represent the fringing magnetic field of the elongate bubble. The passage of a bubble transverse to the direction of light propagation will change the direction of magnetization in film 7, as indicated by arrows b in FIG. 1 so as to tilt or rotate the direction of magnetization in the guide from parallel to the axis of light propagation to perpendicular to it first in one direction as the leading part of the fringing field of the stretched bubble passes under the waveguide and then again as the trailing part of the fringing field passes thereunder. The fringing field $4\pi M_2$ of the bubble B will perturb and interact with the light modes in the waveguide to effect mode switching or modulation of the polarized light. A TM wave or mode, for example, may thus be changed or converted into a TE wave. With no bubble present the waveguide demagnetizing field insures that the direction of magnetization remains parallel to the light axis and little or no mode conversion takes place. As the direction of magnetization is affected by the usual inplane drive field for bubble propagation, its effects will have to be suppressed or compensated by appropriate design of bubble and drive fields and arrangement geometry.

The polarized light L thus modulated is coupled out of the film 7 by a prism Po. As is also true of input coupling prism Pi, Po is preferably made of an anisotropic crystalline or birefringent material, such as rutile. For bubbles having a nominal size of say 5 microns the length of the guide from Pi to Po may be about 0.1 to 0.25 cm. and the domain is preferably stretched to at least a substantial portion of that length, these dimensions being compatible with device application. As will be discussed below for any particular light polarization mode in the film, there will be a distinct film propagation constant. Also there will be different indices of refraction for such prisms for different light polarization modes. As a result, light of one mode or the other may be selectively coupled out of the guide by prism Po. As the passage of a bubble by the light propagation path effects mode conversion of the propagating light in the guide, a light output signal is produced which indicates the passage of each bubble. The output coupler functions, therefore, to effect a sensing of bubble-induced changes in the polarization mode of the light propagating in the guide and thus serves as a detector.

Figure 2:
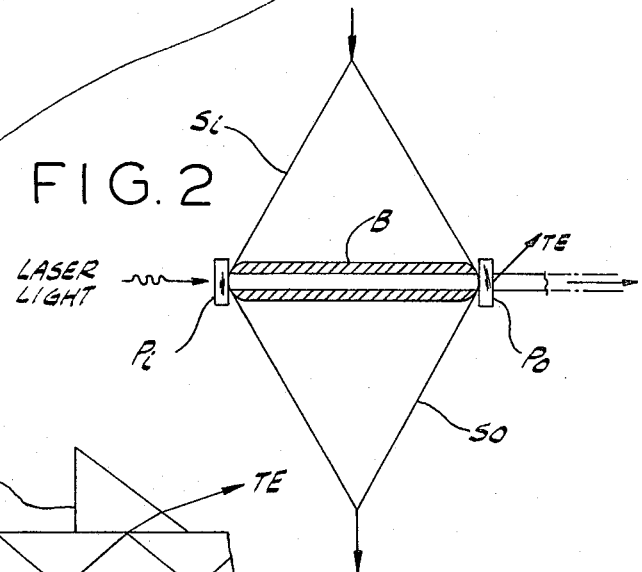
FIG. 2 is a diagrammatic plan view of the detection system portion shown in FIG. 1.
Figure 3:
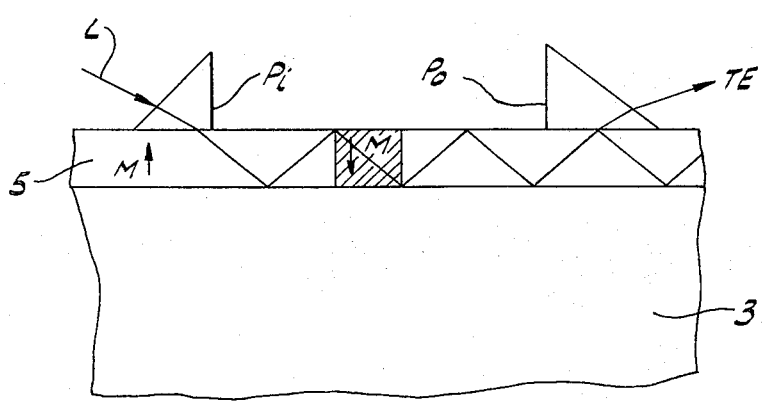
FIG. 3 is a longitudinal cross sectional representation of another magnetic bubble detector useful in a system of this invention.

The detector of FIGS. 1 and 2 employs film 7 as an optical waveguide to sense the passage of stretched magnetic bubbles in the layer 5. However, as illustrated in FIG. 3, the bubble layer 5 itself may be utilized as an optical waveguide where the index of refraction of layer 5 is greater than that of substrate 3. The bubble need not be stretched but should be of a size which corresponds to a half period ($\pi/\beta$) or an uneven multiple thereof, of the light propagating in the guide. The sensitivity of the FIG. 3 embodiment is somewhat less than that where a stretched bubble and a surface film with an in-plane magnetization are utilized, but it will function to detect the passage of bubbles and provide a light output signal indicative thereof. Thus the detection system of this invention may employ single or double film arrangements.

As the selective optical coupling of differently polarized light modes into and out of the waveguide is an important aspect of the detection systems of this invention, the angles of incidence and emergence of both ordinary (TM) and extraordinary (TE) light for rutile prisms as related to the propagation constant ratios $\beta/k$ (where $\beta$ is the film propagation constant and k is the free space propagation constant) are shown in FIGS. 4B and 5B. Where a rutile prism (90°, 45°, 45°) is used as the input coupler Pi, the angle of incidence ( $\Theta$ ) for TM light excitation, where $\beta/k$ is 2.2, is about 11°, as indicated in FIG. 4B. Thus TM light may be selectively coupled into the integrated optics waveguide by directing the laser light at this angle toward the input prism. As TE mode light is preferentially coupled into the waveguide at an angle of over 30° (at $\beta/k = 2.2$.) it can be seen that for a given propagation constant ratio, TM or TE light may be selectively coupled into the waveguide of the detection system.

Referring now to FIG. 5A, a rutile prism (90°, 40°, 50°) is illustrated for exemplary use as an output coupler Po. Where $\beta/k$ is 2.2, the graph of FIG. 5B illustrates that TE mode light will be preferentially coupled out of the waveguide at about 21° while TM light is not coupled out of the guide. Accordingly, by selecting the proper angle of emergence or detection, plane or linearly polarized light of a desired mode may be selectively coupled out of the waveguide.

Figure 6:
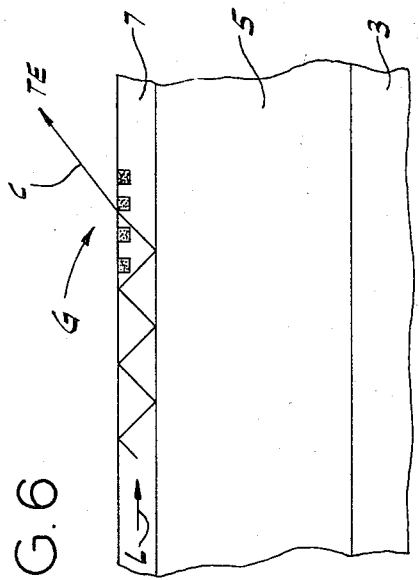
FIG. 6 diagrammatically illustrates a section through a bubble chip utilizing an optical grating to couple light out of the waveguide component of a detection system of this invention.

It will be understood that optical couplers other than prisms may be employed in the detection systems of this invention. For example, FIG. 6 illustrates another means for coupling light out of the waveguide. There an optical grating G formed by a series of parallel spaced rows of ion-implanted stripes, the spacing being a function of the wavelength of light being propagated and the waveguide propagation constant. An exemplary optical grating G was formed by exposing photoresist to a 4880A interferometer fringe pattern, removing the unexposed resist and then ion-implanting the exposed areas to form the implanted stripes with a 0.77 micron spacing (center-to-center) period where the wavelength of the laser light was 1.15 microns and the normalized waveguide propagation constant was 2.2. Alternatively an optical grating may be formed by metallic deposition of the stripes again using conventional masking and deposition techniques so widely used in integrated circuit technology.

Figure 7:
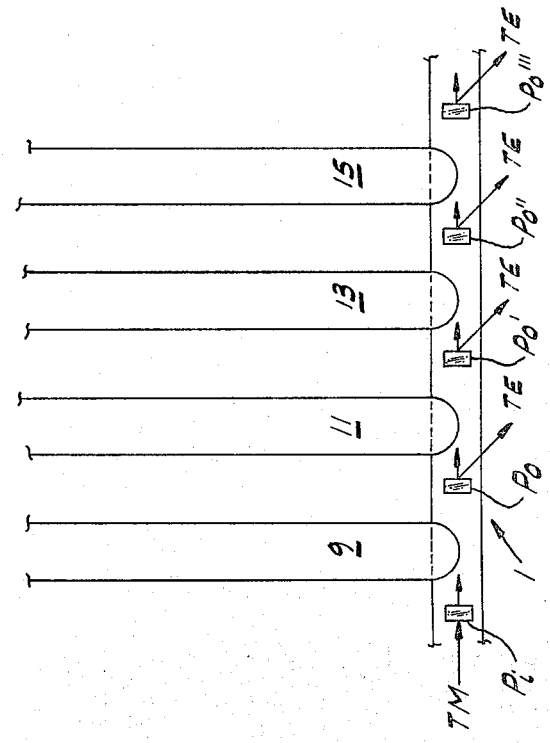
FIG. 7 is a diagrammatic representation of a parallel access magnetic bubble memory system of this invention.

Referring now to FIG. 7 a parallel access magnetic bubble memory system 1 of this invention comprises, as partially shown in FIG. 1, the input coupler or prism Pi positioned on the surface of the optical waveguide film 7 to receive laser light from a source, such as a helium-neon laser source ($\lambda = 1.15$ $\mu$m), and preferentially couple into the guide (by selecting an angle of incidence as discussed above in regard to FIGS. 4A and 4B) TM mode light for propagation down the axis of the guide. A plurality of detectors, respectively including output prisms Po, Po', Po'' and Po''', are positioned in spaced apart relationship along the length of the guide axis. The ends of several minor loops 9, 11, 13 and 15 of a typical magnetic bubble memory organization are positioned so that magnetic bubbles stored in the respective loops are moved past the guide axis on axes that are transverse thereto. The fringing field of a bubble traveling in loop 9 past the guide axis will perturb and modulate the TM light propagating down the guide and generate TE mode light. By selecting the prism angle of coupler Po as discussed above in regard to FIGS. 5A and 5B, TE light will be coupled out of the guide as indicated. The TM mode will continue to propagate down the guide so that the passage of bubbles in minor loops 11, 13 and 15 past the light guide axis will modulate the TM light and thereby generate TE mode light for respective coupling thereof out of the detectors comprising prisms Po', Po'' and Po'''. Thus the passage of a minor loop bubble by the light propagation axis immediately upstream an output coupler prism Po, Po', Po'', or Po''' will provide a discrete light output signal therefrom indicating the passage of such bubble. This provides simultaneous or parallel access to the information stored in each of the minor loops in contrast to the serial access necessitated in prior memory organizations wherein the bubbles from each minor loop must be transferred to a major loop or path for serial passage and detection by a single detector on the chip.

These light output signals may be selectively transmitted to light responsive sensor units, such as germanium avalanche detectors, which will produce electrical signals in response to the light signals received. As these light sensors may be positioned at locations remote from the memory chip with these minor loops, no electrical leads or connections need be provided for this purpose on the chip. Similarly the light output signal beams may be directed to another chip or chips for direct control utilization there.

Figure 8:
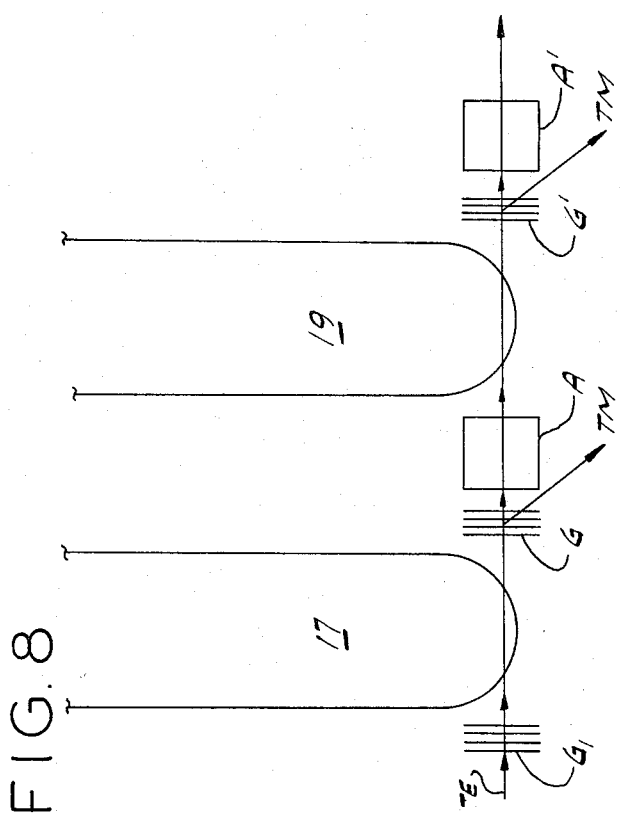
FIG. 8 illustrates another embodiment of a parallel access bubble memory system of this invention.

An alternate embodiment of a detection system of this invention is illustrated in FIG. 8 wherein grating couplers $G_1$, G and $G^1$, such as described above in regard to FIG. 6, are employed rather than prism couplers. In this FIG. 8 system TE light is preferentially coupled into the guide and the passage of a bubble in a minor loop 17 transverse the light guide axis between input grating coupler $G_1$ and output coupler G will generate TM mode light which is selectively coupled out of the guide by G as illustrated. To insure that the polarized light propagating downstream or beyond grating G is essentially TE light, a TM mode absorber A is preferably positioned downstream coupler G. This absorber may be conveniently constituted by a thin metallic film area of permalloy or the like on the surface of the guide and which will substantially attenuate any TM mode light not coupled out of the grating coupler immediately upstream thereof. A similar absorber A' is positioned downstream of output grating $G^1$. Thus TE light continues to be propagated down the guide past each minor loop intersection and with the passage of a magnetic bubble therein modulating this light to provide a discrete TM light output signal at each coupler to indicate such passage.

It will be understood that the magnetic domain detection systems of this invention are particularly well adapted for use with submicron-size bubbles and that dimensions will be appropriately reduced when using smaller bubbles.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A parallel access magnetic bubble memory system comprising:
   a planar thin film optical waveguide for the propagation of linearly polarized light along a first axis;
   means for coupling light into said waveguide;
   a plurality of detectors positioned along the axis of the waveguide; and
   means for moving magnetic bubbles from memory storage locations along respective paths intersecting with said waveguide and transverse to the axis thereof with each of the paths corresponding to a respective detector, each of said detectors including means for coupling light out of said waveguide whereby the movement of magnetic bubbles along any of the respective paths so as to intersect with said waveguide will modulate the polarized light by the fringing fields of said bubbles so as to provide discrete light output signals from each of the detectors corresponding to the paths where magnetic bubble movement intersected with said waveguide, thereby indicating the presence of a bubble for each light output signal produced from the plurality of detectors.

2. A system as set forth in claim 1 wherein the means for coupling light into said waveguide selectively receives light polarized in a first mode and wherein each of the means for coupling light out of said waveguide selectively transmits light polarized in a second mode.

3. A system as set forth in claim 1, wherein each of the paths intersects with said waveguide at a location in advance of the respective detector corresponding thereto.

4. A parallel access magnetic bubble memory system comprising:
a planar thin film optical waveguide for the propagation of linearly polarized light along a first axis;
means for coupling light polarized in a first mode into said waveguide;
a plurality of detectors positioned along the axis of the waveguide;
means for moving magnetic bubbles from memory storage locations past respective detectors on respective second axes each transverse the first axis, each of said detectors including means for coupling light out of said waveguide by selectively transmitting light polarized in a second mode whereby the passage of magnetic bubbles past each respective detector will modulate the polarized light by the fringing fields of said bubbles and provide discrete light output signals from the respective detectors thereby indicating the passage of said bubbles; and
means for selectively absorbing light polarized in said second mode positioned on the first axis adjacent each of said detectors and on the downstream side thereof relative to the direction of the light being propagated along the waveguide whereby light polarized in the first mode is transmitted in the waveguide from one detector towards the next in a downstream direction and light polarized in said second mode is coupled out of each respective detector in response to a bubble passing the light propagation axis directly upstream thereof.

5. A system as set forth in claim 4 in which the light coupled into the waveguide is polarized in the TE mode and TM mode light is coupled out of each detector in response to a bubble passing the light propagation axis immediately upstream thereof, the absorbing means comprising a thin metallic film area positioned on the exposed waveguide surface whereby any TM mode light not coupled out of the upstream detector coupling means is substantially attenuated so that substantially only TE mode light is transmitted from one detector towards the next downstream detector coupling means.

6. A parallel access magnetic bubble memory system comprising:
a planar thin film optical waveguide for the propagation of linearly polarized light along a first axis;
means for coupling light polarized in a first mode into said waveguide;
a plurality of detectors positioned along the axis of the waveguide; and
means for moving magnetic bubbles from memory storage locations past respective detectors on respective second axes each transverse the first axis, each of said detectors including means for coupling light out of said waveguide by selectively transmitting light polarized in a second mode whereby the passage of magnetic bubbles past each respective detector will modulate the polarized light by the fringing fields of said bubbles and provide discrete light output signals from the respective detectors thereby indicating the passage of said bubbles; and
each of the coupling means being a birefringent prism.

7. A parallel access magnetic bubble memory system comprising: a planar thin film optical waveguide for the propagation of linearly polarized light along a first axis;
means for coupling light polarized in a first mode into said waveguide;
a plurality of detectors positioned along the axis of the waveguide; and
means for moving magnetic bubbles from memory storage locations past respective detectors on respective second axes each transverse the first axis, each of said detectors including means for coupling light out of said waveguide by selectively transmitting light polarized in a second mode whereby the passage of magnetic bubbles past each respective detector will modulate the polarized light by the fringing fields of said bubbles and provide discrete light output signals from the respective detectors thereby indicating the passage of said bubbles; and
each of the coupling means being an optical grating.

8. A parallel access magnetic bubble memory system comprising:
a planar layer of magnetic material in which magnetic bubbles are moved and which has a magnetization perpendicular to the plane of said layer,
a planar thin film optical waveguide for the propagation of linearly polarized light along a first axis, said planar film optical waveguide being positioned on the surface of said layer of magnetic material in which the magnetic bubbles are moved and having a magnetization in the plane thereof;
means for coupling light polarized in a first mode into said waveguide;
a plurality of detectors positioned along the axis of the waveguide; and
means for moving magnetic bubbles in said planar layer of magnetic material from memory storage locations past respective detectors on respective second axes each transverse the first axis, each of said detectors including means for coupling light out of said waveguide by selectively transmitting light polarized in a second mode whereby the passage of magnetic bubbles past each respective detector will modulate the polarized light by the fringing fields of said bubbles and provide discrete light output signals from the respective detectors thereby indicating the passage of said bubbles.

9. A system as set forth in claim 8 in which the film has a greater index of refraction than that of said layer.

10. A system as set forth in claim 8 in which said thin planar film is overlaid on the surface of the layer and projects outwardly therefrom.

11. A system as set forth in claim 10 wherein said planar film comprises an epitaxial film.

12. A system as set forth in claim 11 wherein the layer is constituted by a magnetic surface layer of a garnet chip and said film is a magnetic garnet film epitaxially deposited on said layer.

13. A system as set forth in claim 8 wherein the thin film is formed in an exposed surface of said layer.

14. A system as set forth in claim 13 wherein the film is an ion-implanted film.

15. A system as set forth in claim 14 wherein the layer constitutes one surface layer of a garnet chip and said film is formed by ion implantation in said layer.

16. A system as set forth in claim 8 wherein each detector further includes means responsive to the output signal light emerging from its coupling means at a preselected angle to provide an electrical signal indicative of the passage of a bubble.

17. A system as set forth in claim 16 in which the light responsive means is a germanium avalanche detector.

18. A parallel access magnetic bubble memory system comprising:
- a planar thin film optical waveguide for the propagation of linearly polarized light along a first axis;
- means for coupling light polarized in the TM mode into said waveguide;
- a plurality of detectors positioned along the axis of the waveguide; and
- means for moving magnetic bubbles from memory storage locations past respective detectors on respective second axes each transverse the first axis, each of said detectors including means for coupling light out of said waveguide by selectively transmitting light polarized in a TE mode in response to a bubble passing the light propagation axis immediately upstream thereof relative to the direction of light being propagated along the waveguide, whereby the passage of magnetic bubbles past each respective detector will modulate the polarized light by the fringing fields of said bubbles and provide discrete light output signals from the respective detectors thereby indicating the passage of said bubbles.

* * * * *